United States Patent [19]
Ueno et al.

[11] Patent Number: 5,497,118
[45] Date of Patent: Mar. 5, 1996

[54] SIGNAL SELECTOR CIRCUIT AND SIGNAL-GENERATING CIRCUIT

[75] Inventors: Toshiaki Ueno, Yokohama; Shigeru Nakagawa, Kawasaki, both of Japan

[73] Assignee: Hewlett-Packard Company, Palo Alto, Calif.

[21] Appl. No.: 93,824

[22] Filed: Jul. 19, 1993

[30] Foreign Application Priority Data

Jul. 31, 1992 [JP] Japan .................................. 4-224728

[51] Int. Cl.$^6$ ............................................. H03K 17/693
[52] U.S. Cl. .......................... 327/416; 327/427; 327/431
[58] Field of Search ..................................... 327/378, 387, 327/389, 396, 416, 431, 435, 436, 563, 52, 415, 417, 427; 326/105

[56] References Cited

U.S. PATENT DOCUMENTS

| | | | |
|---|---|---|---|
| 2,994,013 | 7/1961 | Skellett | 307/571 |
| 3,588,540 | 6/1971 | Bohn | 307/251 |
| 3,602,738 | 8/1971 | Bohn | 327/416 |
| 3,885,167 | 5/1995 | Berglund | 327/416 |
| 4,810,911 | 3/1989 | Noguchi | 307/571 |
| 4,908,531 | 3/1990 | Podell et al. | 307/571 |
| 4,926,879 | 5/1990 | Sevrain et al. | 128/798 |
| 5,003,246 | 3/1991 | Nadd | 327/416 |
| 5,204,563 | 4/1993 | Jason | 307/585 |

OTHER PUBLICATIONS

"Modeling and Design of GaAs MESFET Control Devices for Broad–Band Applications,"; N. Jain & R. J. Gutmann, IEEE Transactions on Microwave and Techniques, vol. 38, No. 2; Feb. 1990, pp. 109–117.

"Distortion in Broad–Band Gallium Arsenide MESFET Control and Switch Circuits", R. H. Caverly; IEEE Transactions on Microwave and Techniques, vol. 39, No. 4; Apr. 1991; pp. 713–717.

"GaAs MMIC SPDT Switch Technical Data, Hewlett Packard". 1991, pp. 1–4.

*Primary Examiner*—Timothy P. Callahan
*Assistant Examiner*—My-Trang Nu Ton

[57] ABSTRACT

The invention is intended to offer a signal selector circuit and a signal-generating circuit which are excellent in linearity between input and output signals at high frequencies and in isolation between input signals and isolation between output signals and which do not produce distortion. When an output signal is taken from $OUT_1$, a circuit connected with the gate terminal of $Q_{11}$ is made to have a high impedance, and a cutoff voltage deeper than the pinchoff voltage is applied to the gate of $Q_{12}$. With respect to each of $Q_{11}$, $Q_{12}$, the gate is connected with the source by $R_{11}$ or $R_{12}$. Both $Q_{11}$ and $Q_{12}$ have depletion characteristics. The resistances of $R_{11}$ and $R_{12}$ are lower than the impedances of $Q_{15}$ and $Q_{16}$ when they drive the gates so as to turn on $Q_{11}$ and $Q_{12}$. In this case, therefore, the voltage between the gate and the source of $Q_{11}$ is made null and $Q_{11}$ conducts. $Q_{12}$ is cut off. The voltage between the gate and the source is zero or maintained at a constant value irrespective of the state of the passing signal. Hence, self-modulation which would have been encountered in the prior art techniques can be prevented.

13 Claims, 9 Drawing Sheets

(A)

(B)

【図9】

SIGNAL SELECTOR CIRCUIT AND SIGNAL-GENERATING CIRCUIT

FIELD OF THE INVENTION

The present invention relates to a signal selector circuit and to a signal-generating circuit and, more particularly, to these circuits which are excellent in linearity between the input and output signals at high frequencies and in isolation between the input signals and between the output signals and which can produce output having no or low distortion.

BACKGROUND OF THE INVENTION

In recent years, digital signal-processing techniques have been introduced to electronic measuring instruments or video apparatus in addition to conventional analog signal-processing techniques. Especially, waveform memories, transient recorders, LSI testers treating both analog and digital signals, and other apparatus which convert analog signals from plural objects to be observed into digital form and record the digital data on a semiconductor memory or the like use multiplexer circuits for selecting one out of the output signals from plural apparatus.

A multiplexer circuit used for this purpose is generally required to have higher performance than the accuracy of the A/D converter connected at the next stage. Of course, a demultiplexer circuit which is opposite in function to the multiplexer circuit described above and divides the output signal from a single signal source into two or more for a desired number of apparatus is of importance similarly.

A multiplexer circuit is required to exhibit the following characteristics: When it is conducting, the ON resistance between the input and the output is low; The parasitic reactance of the switching portion is low, and the RF characteristics are excellent; The residual offset voltage is low; The dynamic range of the treated signal is wide.

On the other hand, the multiplexer circuit is required to exhibit the following characteristics when it is cut off: The OFF resistance is high when a signal is applied or delivered; The leakage current flowing in or out is small; The isolation between the input and the output is high. Preferably, the switching speed when a switch is made is high. Also, the driving voltage needed for switching is low, and the electric power consumed is low.

Taking account of the characteristics described above, relays or reed relays have been heretofore chiefly used for switching of DC signals. For switching of RF signals, mechanical relays such as coaxial relays have been predominantly employed. However, these devices have suffered from unsatisfactory lifetimes and reliability-because of their mechanical structure.

Meanwhile, multiplexer circuits using semiconductor switches have been developed in recent years. Typical semiconductor devices of this kind are discussed in IEEE transactions Microwave Theory And Techniques, Vol. 38, No. 2, pp. 109–117, February 1990.

FIG. 8 is a schematic showing the fundamental structure of a 1:2 demultiplexer circuit using semiconductor switches described in the above-described paper. A 1:N demultiplexer can be built by making a multiple stage cascade connection as shown in FIG. 9. In particular, the first stage consists of a demultiplexer circuit 71. Similarly, the second stage consists of demultiplexer circuits 72 and 73. The third stage consists of demultiplexer circuits 74–77.

In this figure, each of $Q_1 Q_4$ consists of an N-channel MESFET made of gallium arsenide. Each has such a characteristic that the drain current $I_D$ decreases with reducing the bias voltage $V_{gs}$ applied between the gate and the source as shown in FIG. 10. This is a so-called depletion characteristic. In this figure, when $V_{gs} = 0$, $I_D = I_{DSS}$.

In this example, $Q_1$ and $Q_2$ are FETs performing main switching action. The source terminals of these switching FETs act as output terminals $OUT_1$ and $OUT_2$, respectively. $Q_3$ and $Q_4$ are shunting FETs serving to improve the isolation between the two output terminals by short-circuiting the deactivated output terminals to ground.

For example, in FIG. 8, in order to cause the switch on the side of $Q_1$ to conduct, the voltage $V_{gs}$ between the gate and the source of each of $Q_1$ and $Q4$ is set to 0 V, and $V_{gs}$ between the gate and the source of each of $Q_2$ and $Q_3$ is biased negative more than the pinchoff voltage $V_p$ to bring the FETs into cutoff condition.

In the circuit described above, MESFETs made of gallium arsenide are used and, therefore, the amount of leakage current is relatively small. Also, the parasitic capacitance between electrodes is small. Especially, a demultiplexer or multiplexer in which the isolation between the output terminals at high frequencies is comparatively good can be accomplished.

Although the DC characteristics of the multiplexer circuit shown in FIG. 8 is relatively good, the voltage between the gate and the source is subject to modulation by the RF current applied via the parasitic capacitance between the gate and the source, for example, since the gate voltage of conducting $Q_1$ and $Q_2$ is maintained at a constant voltage. Therefore, the linearity between the input and the output deteriorates at higher frequencies. Hence, the output waveform is distorted.

SUMMARY OF THE INVENTION

It is an object of the present invention to provide a signal selector circuit and a signal-generating circuit which comprise multiplexer circuits using gallium arsenide MESFETs, silicon junction FETs, or the like and which aleviate deterioration of the linearity between the input and output signals at high frequencies and prevent the output waveform from becoming distorted.

A signal selector circuit according to the invention comprises a pair of switching FETs having a depletion characteristic or depletion/enhancement combined characteristics. The coupled drain terminals are used as a signal input terminal. The uncoupled source terminals are used as signal output terminals. A circuit connected with the gate terminal of each switching FET is made of a circuit which exhibits a high impedance when the gate is activated so as to drive the FET on. When the gate of each switching FET is short-circuited to the source or to the drain or when the FET is driven on, the gate is connected with the source or drain via a resistance lower than the impedance of the circuit connected with the gate terminal.

When the signal is produced from the source terminal of one switching FET (herein referred to as the first switching FET), the circuit connected with the gate terminal of the first switching FET is made to show a high impedance. A cutoff voltage deeper than the pinchoff voltage $V_p$ is applied to the other switching FET (herein referred to as 'the second switching FET).

As described above, the gate of each switching FET used in the invention is short-circuited to the source or connected with the source via a resistance lower than the impedance (the impedance when the FET is driven on) of the circuit connected with the gate terminal. The switching FET has a depletion characteristic or depletion/enhancement combined characteristics. Therefore, the voltage $V_{gs}$ between the gate and the source of the first switching FET becomes null or low enough to bias the switching FET into conduction. As a result, the FET conducts. A cutoff voltage deeper than the pinchoff voltage $V_p$ is applied to the gate of the second switching FET and so the second FET is cut off. It is to be noted that $V_{gs}$ and $V_p$ represent absolute values; neither positive sign nor negative sign is taken into account.

In the conventional signal selector circuit (see the demultiplexer circuit shown in FIG. 8), the gate voltage is kept constant and, therefore, the voltage $V_{gs}$ between the gate and the source is varied with variations in the passing signal. Consequently, there is a high possibility of self-modulation. In the novel signal selector circuit, the voltage $V_{gs}$ between the gate and the source is made null or maintained constant irrespective of the state of the passing signal. In consequence, self-modulation as encountered in the prior art techniques is prevented.

MESFETs made of gallium arsenide are preferably used as the above-described switching FETs. Other types of FET such as silicon junction FET or MOSFET may also be used if the FET has a depletion characteristic or depletion/enhancement combined characteristics.

The circuit connected with the gate terminal of each switching FET should have a high impedance when the gate is driven so as to drive on the FET. For instance, a reed relay can be used. The reed relay exhibits a high impedance when it is open. Thus, it can drive the switching FET into conduction. However, it is inferior in life and reliability. Therefore, semiconductor switching devices which can be fabricated on a substrate integrally with the switching FETs are used preferably as the circuit connected with the gate terminal.

Usually, gallium arsenide MESFETs, silicon junction FETs, or MOSFETs which are similar to the above-described switching FETs, adapted for high-speed switching, and produces less leakage current are used preferably as the circuit connected with the gate terminal.

The novel signal selector circuit is fundamentally a demultiplexer circuit.

However, the input terminal, the output terminal, and the control terminal of an FET are used as a drain, a source, and a gate, respectively. Generally, the drain and the source are symmetrical in structure. Therefore, the novel signal selector circuit can be used as a demultiplexer and as a multiplexer as well.

In this case, the input terminal and the output terminal of the demultiplexer circuit are taken as the output terminal and the input terminal of a multiplexer circuit. In other words, the coupled drain terminals and the uncoupled source terminals of the demultiplexer circuit act as the coupled source terminals and as the uncoupled drain terminals, respectively, of the multiplexer circuit.

Where the novel signal selector circuit is used as a multiplexer, the voltage between the gate and the source of each switching FET that is conducting is zero or maintained at a constant voltage (a voltage drop due to a resistor short-circuiting the gate to the source). Therefore, the self-modulation encountered in the prior art techniques is not produced in the same way as in the case of the demultiplexer circuit.

Where signal selector circuits according to the invention are employed respectively as a multiplexer circuit and as a demultiplexer circuit at the same time, bidirectional signals can be switched with high linearity' without producing waveform distortion.

Where the above-described plural signal selector circuits are cascaded in plural stages, i.e., a 1:2 demultiplexer circuit or a 2:1 multiplexer circuit, the aforementioned advantages can also be had.

More specifically, the plural signal selector circuits used as the above-described 1:2 demultiplexer circuit are connected in multiple cascade in such a manner that the source terminals of switching FETs at one stage of signal selector circuit are connected with the drain terminals of switching FETs at the next stage of signal selector circuit. Thus, a 1N demultiplexer circuit can be built. If signal selector circuits used as the 2:1 multiplexer circuit are cascaded, then an HI multiplexer circuit can be fabricated. N is normally $2^{k+1}$, where k is a positive integer.

The novel signal selector circuit is further characterized in that it has an operational amplifier at the input stage of a signal selector circuit used as the above-described demultiplexer circuit, and that the selector circuit has a circuit feeding the output signal from the demultiplexer circuit back to the operational amplifier.

In this case, the effects of the ON resistance of the switching FETs, the temperature variations, and the variations in the characteristics among manufactured products can be eliminated. Hence, a signal selector circuit can be realized in which the output waveform agrees with the input waveform at all times.

Especially, where signal selector circuits are connected in several stages, the value of the ON resistance is increased by a factor equal to the number of the stages of the switching FETs and so a waveform distortion is highly likely to be produced. Signal switching free from distortion can be attained by feeding the output signal back to the operational amplifier.

Shunting FETs as shown in FIG. 8 can be introduced to the novel signal selector circuit. In this case, the output terminals of the switching FETs can be grounded when they are biased into cutoff. The isolation between the output terminals can be enhanced.

In addition, a signal-generating circuit can be built, using the above-described signal selector circuit. A signal-generating circuit which is hardly affected by the source resistance or by the ON resistance of switching FETs can be accomplished by connecting a single constant-current signal source using an operational amplifier or the like with the input terminal of the signal selector circuit. Where plural constant-current signal sources are connected with the input terminal, the plural signals are summed up. The combined signal can be taken from a desired output terminal without being affected by the ON resistance.

That is, the novel signal selector circuit is characterized in that a signal supply circuit consisting of two or more constant-current signal sources is connected with the input terminal of the signal selector circuit, and that the signal supply circuit consists of two or more constant-current signal sources. The output signals from these signal sources are summed up and applied to the input terminal of the signal selector circuit.

The signal selector circuit can also be built by connecting the output terminals of plural constant-current signal sources in parallel. Plural constant-voltage signal sources may be connected with the input terminal of an adder, and the output voltage from this adder may be converted into a constant-current signal.

In a signal selector circuit for a digital signal, if the output waveform is distorted, no serious problems take place, because the linearity of the signal selector circuit is poor. On the other hand, in a signal selector circuit for an analog signal, if the waveform is distorted because of poor linearity of the switching, FETs, the measuring accuracy is deteriorated in the case of an electronic instrument, for example. Therefore, it has been inevitable that in instruments treating high-frequency analog signals, signal selector circuits such as demultiplexers or multiplexers adopt reed relays or other mechanical switches.

In contrast, in the novel signal selector circuit or signal-generating circuit, analog signals or combinations of analog and digital signals can be switched without distorting the waveforms.

BRIEF DESCRIPTION OF THE DRAWINGS

FIG. 2(A) is an equivalent circuit diagram showing the condition in which $Q_{11}$ is cut off; FIG. 2(B) is an equivalent circuit diagram showing the condition in which it is conducting;

FIG. 5(A) is a circuit diagram of a signal source; FIGS. 5(B) and 5(C) are diagrams of signal supply circuits;

FIG. 10 is a graph showing the characteristic of an FET having depletion characteristic.

DETAILED DESCRIPTION OF PREFERRED EMBODIMENTS

Figure 1:
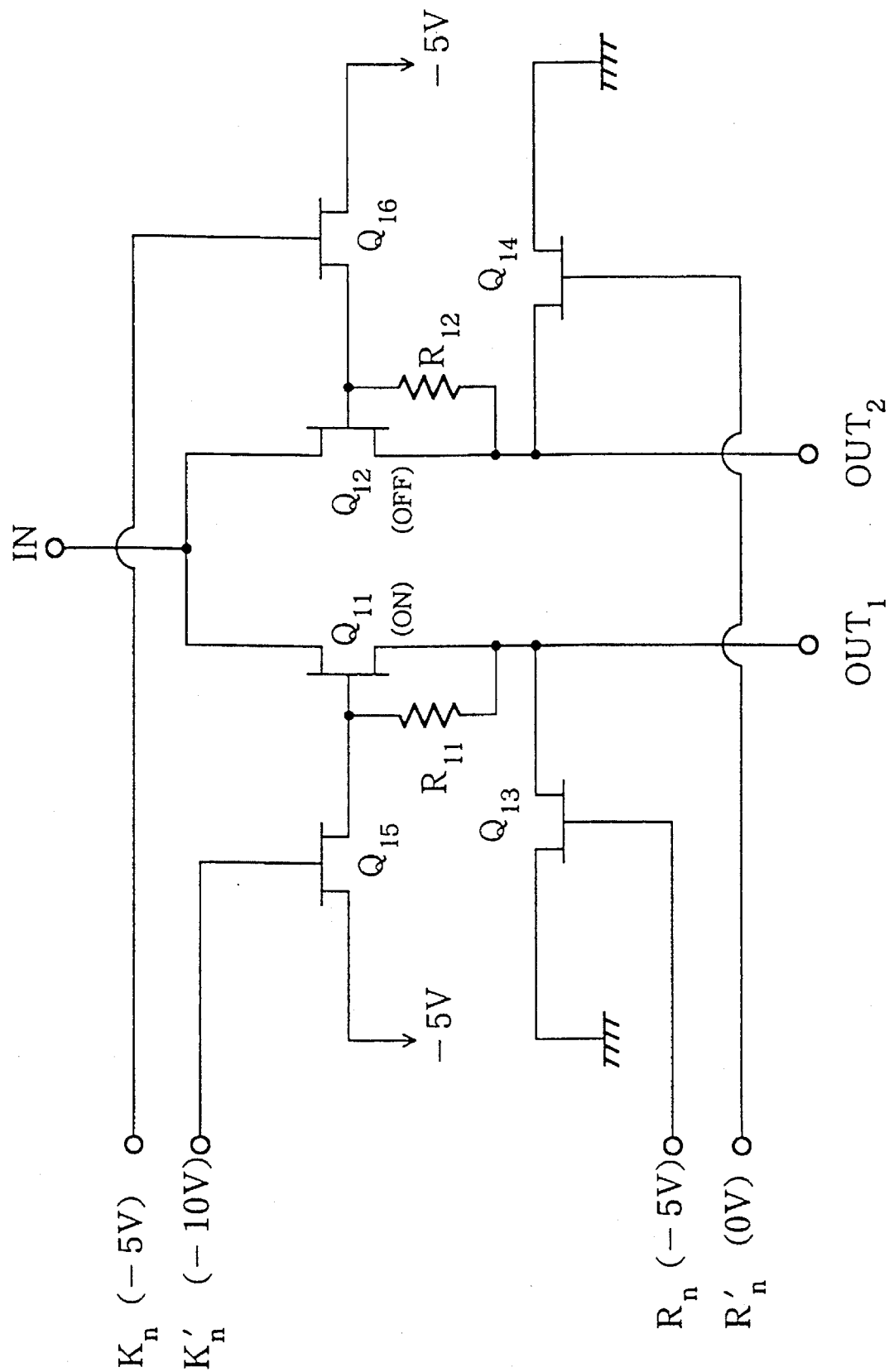
FIG. 1 is a diagram illustrating a 1:2 demultiplexer circuit, for illustrating a signal selector circuit according to the invention.

Embodiments of the present invention are hereinafter described by referring to the drawings.

FIG. 1 shows the fundamental configuration of a 1:2 demultiplexer circuit adapted to illustrate an embodiment of a signal selector circuit according to the invention.

In this figure, the demultiplexer circuit comprises switching FETs (FETs performing main switching action) $Q_{11}$, $Q_{12}$ having a resistor $R_{11}$, $R_{12}$ of a given value connected between the gate and the source, FETs $Q_{15}$, $Q_{16}$ (referred to also as gate-driving FETs) for driving the gates of $Q_{11}$, $Q_{12}$, and FETs $Q_{13}$, $Q_{14}$ (herein referred to as the shunting FETs) for grounding the output terminals of $Q_{11}$–$Q_{12}$. For the convenience of illustration, $Q_{11}$ is assumed to be ON, while $Q_{12}$ is assumed to be OFF.

In the present embodiment, not only the switching FETs $Q_{11}$, $Q_{12}$ but also the gate-driving FETs $Q_{15}$, $Q_{16}$ and the shunting FETs $Q_{13}$, $Q_{14}$ have depletion characteristics. Preferably, N-channel MESFETs made of gallium arsenide and having small junction capacitance are used as these $Q_{11}$–$Q_{16}$. Where the junction capacitance does not pose serious problems, silicon junction FETs or MOSFETs may be used.

The drain terminals of the switching FETs $Q_{11}$, $Q_{12}$ are coupled together. The coupled terminals form a signal input terminal IN. The resistance $R_{11}$ between the gate and the source of $Q_{11}$ and the resistance $R_{12}$ between the gate and the source of $Q_{12}$ are made lower than the output impedances on the sides of the drains of $Q_{15}$, (the impedances as viewed from the drain terminals).

The drain terminals of the gate-driving FETs $Q_{15}$, $Q_{16}$ are connected with the gate terminals of $Q_{11}$ $Q_{12}$, respectively. The $Q_{15}$ takes a high impedance when $Q_{11}$ is conducting. When $Q_{11}$ should be biased into cutoff, a cutoff voltage exceeding the pinchoff voltage $V_p$ is applied to the gate terminal of $Q_{11}$. Similarly, the $Q_{16}$ takes a high impedance when $Q_{12}$ should be made to conduct. When the should be driven into cutoff, a cutoff voltage exceeding $V_p$ is applied to the gate terminal of $Q_{12}$.

The shunting FETs $Q_{13}$ and $Q_{14}$ improve the isolation between the two output terminals of $Q_{11}$ and $Q_{12}$ by grounding the disconnected output terminals of $Q_{11}$ and $Q_{12}$.

Since the values of the $R_{11}$ and $R_{12}$ are determined appropriately, depending on the circuits connected with the output terminals OUT1 and OUT2, on the switching FETs $Q_{11}$ and $Q_{12}$, on the circuits (in this case, the gate-driving FETs $Q_{15}$, $Q_{16}$) connected with the gates of the switching FETs, and on the characteristics of the shunting FETs $Q_{13}$ and $Q_{14}$, it is impossible to specify the values.

In the present embodiment, the ranges of the numerical values of $R_{11}$ and $R_{12}$ are determined as follows.

Figure 2:
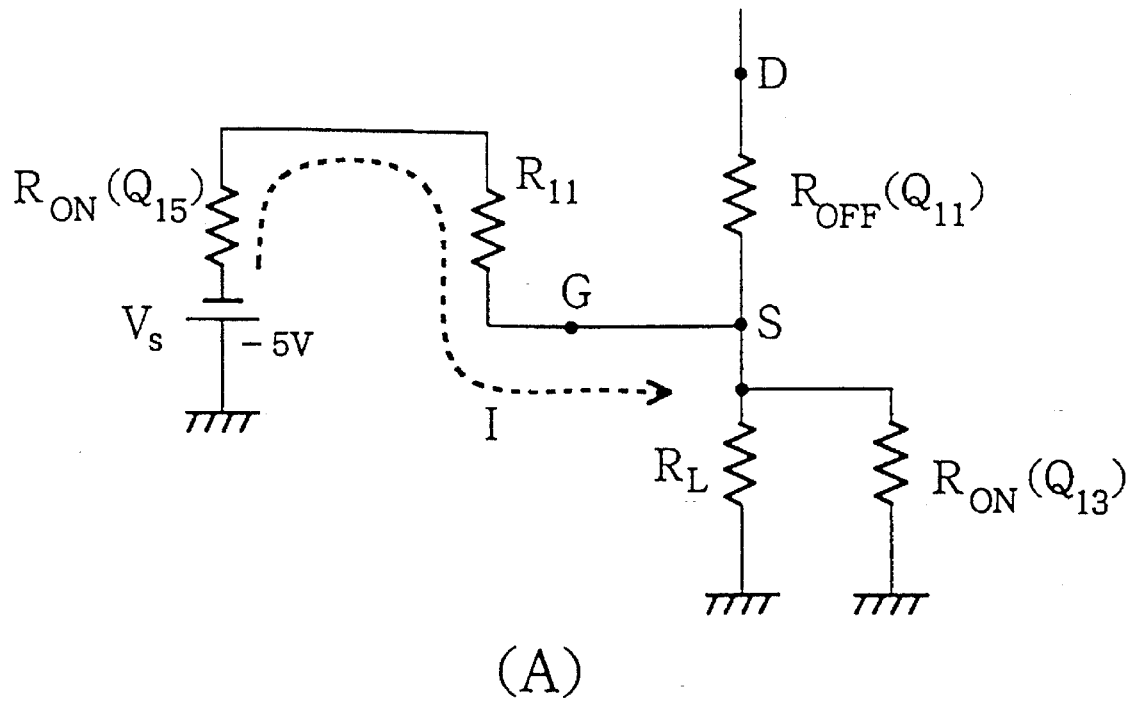
FIG. 2 shows diagrams for considering the ranges of numerical values of $R_{11}$ and $R_{12}$ of the demultiplexer circuit shown in FIG. 1.
Figure 2:
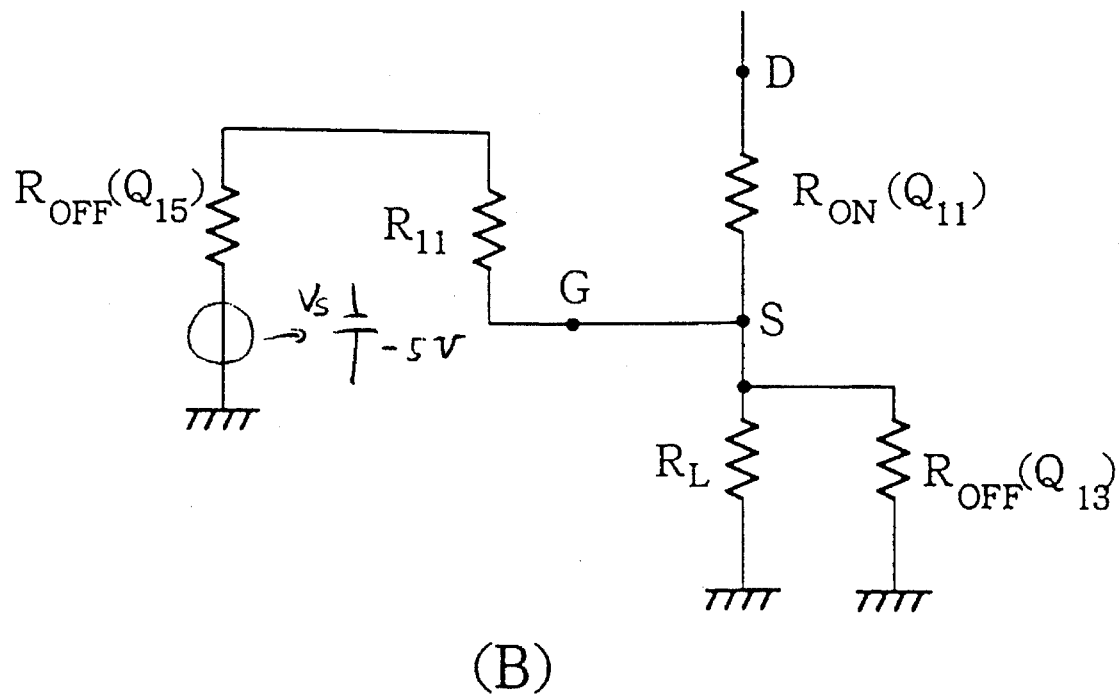

FIG. 2, (A) and (B), show equivalent circuits when $Q_{11}$ shown in FIG. 1 is cut off and conducting, respectively.

In FIG. 2, (A) and (B), $R_{ON}$ and $R_{OFF}$ are the ON resistance and the OFF resistance of each FET included in the parentheses For the sake of illustration, the values of $R_{ON}$ and $R_{OFF}$ are the same ($R_{ON}$= 100 o and $R_{OFF}$=100 Mo) for each FET. Let us assume that the load resistance RL is 10 o.

When $Q_{11}$ is cut off, $Q_{13}$ and $Q_{15}$ are driven on. As shown in FIG. 2(A), current I (negative current in the figure) flows out of the source of $Q_{15}$ and passes through a power supply $V_s$ for the source of $Q_{15}$, through RON ($Q_{15}$), through $R_{11}$, and through a parallel circuit of $R_L$ and $R_{ON}$ ($Q_{13}$).

The resistance value of $R_{11}$ is preferably so set that the current I flowing into $R_L$ and $R_{ON}$ ($Q_{13}$) out of the gate-driving circuit via $R_{11}$ is reduced.

$$I = \frac{V_s}{R_{ON}(Q_{15}) + R_{11} + \frac{R_L R_{ON}(Q_{13})}{R_L + R_{ON}(Q_{13})}}$$

Thus, ideally, $R_{11}$ is set to infinity.

On the other hand, when $Q_{11}$ is conducting (see FIG. 2(B)), the relation $R_{OFF} \gg R_{11}$ holds usually. Therefore, the value of $R_{11}$ does not present serious problems. Ideally, the voltage between the gate (G) and the source (S) is 0 V. Preferably, therefore, $R_{11}$=0 r.

It can be seen from the above considerations that in the present embodiment, $R_{11}$ and $R_{12}$ are preferably set to about 1 kr to several M r.

We now describe in detail the principle of operation of the above-described multiplexer circuit while taking the case in which $Q_{11}$ is conducting but $Q_{12}$ is cut off as an example. To simplify the illustration, it is assumed that the values of $V_p$ of all of $Q_{11}$–$Q_{16}$ are 1 V.

It is also assumed that the source potentials of the gate-driving FETs $Q_{15}$ and $Q_{16}$ are −5 V and that either −10 V or −5 V is applied to the gates of the $Q_{15}$ and $Q_{16}$.

In FIG. 1, the gate potential of one gate-driving FET $Q_{15}$ is −10 V and so it is cut off. Since the gate potential of the other gate-driving FET $Q_{16}$ is −5 V, it is conducting. Because the output impedance on the side of the drain of $Q_{15}$ is sufficiently large compared with the resistance $R_{11}$, the gate potential of $Q_{11}$ is placed in the same potential as the source of $Q_{11}$ via the resistance $R_{11}$. Therefore, $Q_{11}$ conducts. Meanwhile, the gate potential of the other $Q_{12}$ becomes −5 V via $Q_{16}$ and so it is cut off.

Since the $Q_{15}$ that is cut off is connected with the gate terminal of the conducting $Q_{11}$, the leakage current flowing into the source of $Q_{11}$ out of the drain terminal of $Q_{15}$ via $R_{11}$ is quite small. Also, the gate terminal and the source terminal of $Q_{11}$ are kept at the same potential. Consequently, the potential between the gate and the source is regulated against variations in the current flowing between the drain and the source of $Q_{11}$. That is, self-modulation does not occur. Therefore, such an operation is anticipated that the linearity between the input and output signals at high frequencies is good.

The above-described circuit can also be used as a multiplexer circuit which selects one out of signals applied to the output terminals $OUT_1$ and $OUT_2$ and supplies it to the input terminal IN.

Figure 3:
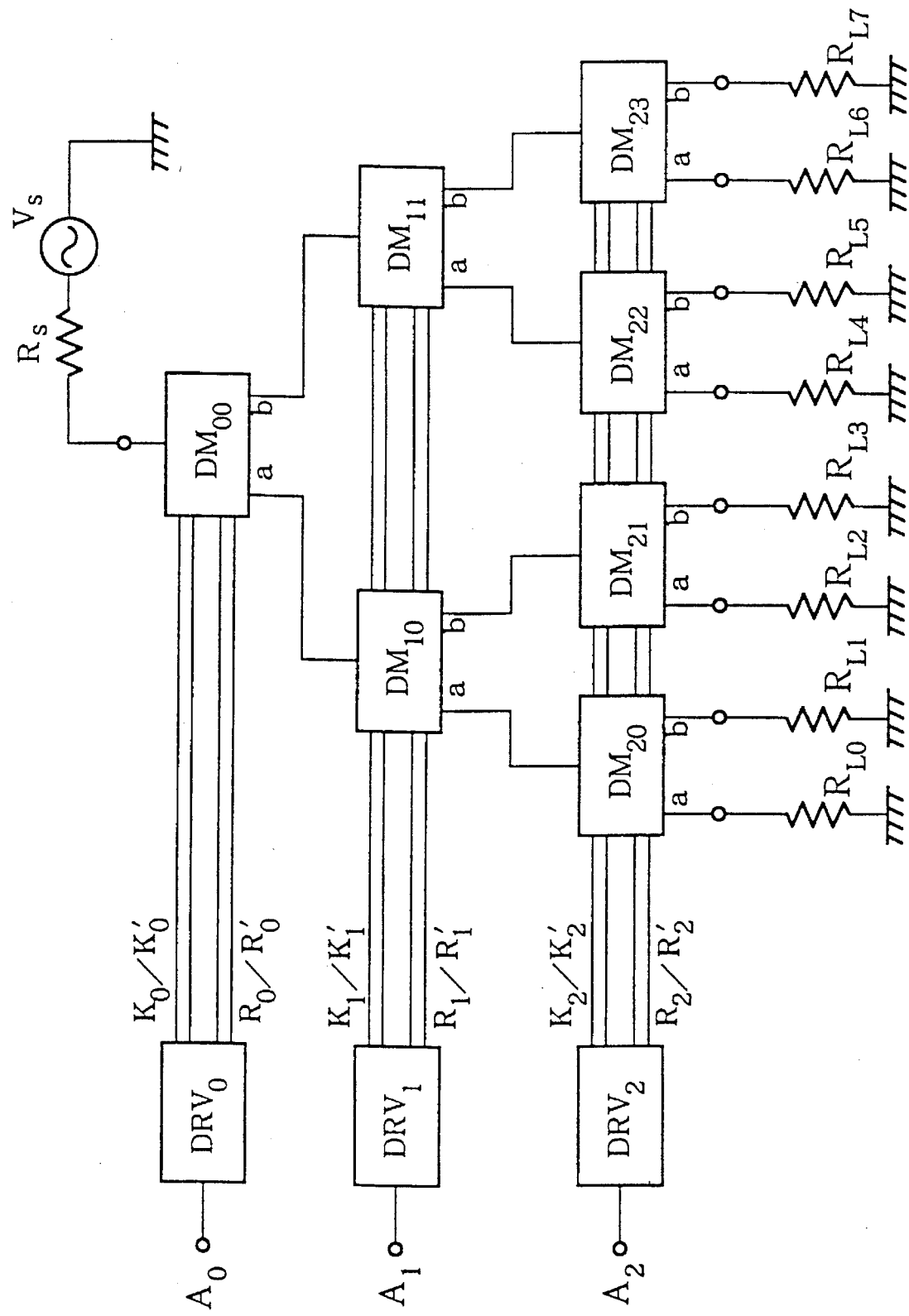
FIG. 3 is a diagram of a 1:8 demultiplexer circuit, for illustrating another signal selector circuit according to the invention.

A 1:N demultiplexer circuit which selects one out of N output terminals and delivers the signal applied to a single input terminal through the selected output terminal is next described by referring to FIG. 3.

The figure shows a 1:8 demultiplexer circuit in which plural 1:2 demultiplexer circuits described in connection with FIG. 1 are cascaded in plural stages (three stages in the figure). A driver circuit is connected with each stage of demultiplexer circuit to drive it. In FIG. 3, the demultiplexer circuit at the first stage is indicated by $DM_{00}$. The demultiplexer circuits at the second stage are indicated by $DM_{10}$ and $DM_{11}$, respectively. The demultiplexer circuits at the third stage are indicated by $DM_{20}$, $DM_{21}$, $DM_{22}$, and $DM_{23}$, respectively. The driver circuits at the first, second, and third stages are indicated by $DRV_0$, $DRV_1$, and $DRV_2$, respectively. Loads $R_{L0}$–$R_{L7}$ each having one end terminal grounded are connected with the source terminals (not shown) of the demultiplexer circuits $DM_{20}$–$DM_{23}$, respectively, at the final stage, or the third stage. A constant-voltage signal source $V_s$ having a power resistance $R_s$ is connected with the input terminal.

The aforementioned driver circuits $DRV_0$, $DRV_1$, and $DRV_2$ produce control signals to appropriately operate the demultiplexers $DM_{00}$, $DM_{10}$, $DM_{11}$, $DM_{20}$, $DM_{21}$, $DM_{22}$, and $DM_{23}$ at the various stages.

These control signals comprise $K_0$, $K-_0$, $K_1$, $K-_1$, $K_2$, $K-_2$, $R_0$, $R-_0$, $R_1$, $R_1$, $R_2$, and $R-_2$ to drive on and cut off the gate-driving FETs and the shunting FETs of the demultiplexer circuits at the various stages.

One bit of digital control signal $A_0$, one bit of digital control signal $A_1$, and one bit of digital control signal $A_2$ are applied to the driver circuits $DRV_0$, $DRV_1$, and $DRV_2$, respectively. In total, three bits are applied. The driver circuits $DRV_0$, $DRV_1$, and $DRV_2$ deliver control signals $K_n$, $K-_n$, $Rn$, and $R-_n$ (n=0, 1, 2) for selecting one out of the switching FETs of each demultiplexer circuit at each stage, depending on whether each control signal is 0 or 1.

For example, when it is desired to take the input signal from the terminal to which $R_{L5}$ is connected, $DRV_0$, $DRV_1$, and $DRV_2$ deliver the control signals $K_n$, $K-_n$, $R_n$, and $R-_n$ (n=0, 1, 2) in such a way that a signal appears at output terminal b of $DM_{00}$, a signal appears at output terminal a of $DM_{11}$, and a signal appears at output terminal b of $DM_{22}$.

In this way, in the 1:8 demultiplexer circuit described above, desired output terminals can be easily selected by using the same number of driver circuits as the number of stages of 1:2 cascaded demultiplexer circuits shown in FIG. 1.

In addition, those output terminals which are not selected are grounded by the shunting FETs of the demultiplexer circuits at some stage. For example, in the above example, $R_{L0}$ is grounded by the shunting FET on the side of the output terminal a of $DM_{20}$, while $R_{L1}$ is grounded by the shunting FET on the side of the output terminal a of $DM_{00}$.

In this manner, a demultiplexer in which the isolation between the output terminals is excellent can be realized.

In the configuration of FIG. 3, all the output terminals not connected with the input are grounded by $Q_{13}$ or $Q_{14}$ when viewed from the output terminal of the demultiplexer circuit. Therefore, it has the advantage that a residual signal due to offset voltage, current, or crosstalk does not appear at the load ends. Also in FIG. 3, 1:2 demultiplexer circuits of the structure shown in FIG. 3 are connected in three stages. It is possible to cope with more output signals by increasing the number of stages connected in cascade.

Figure 4:
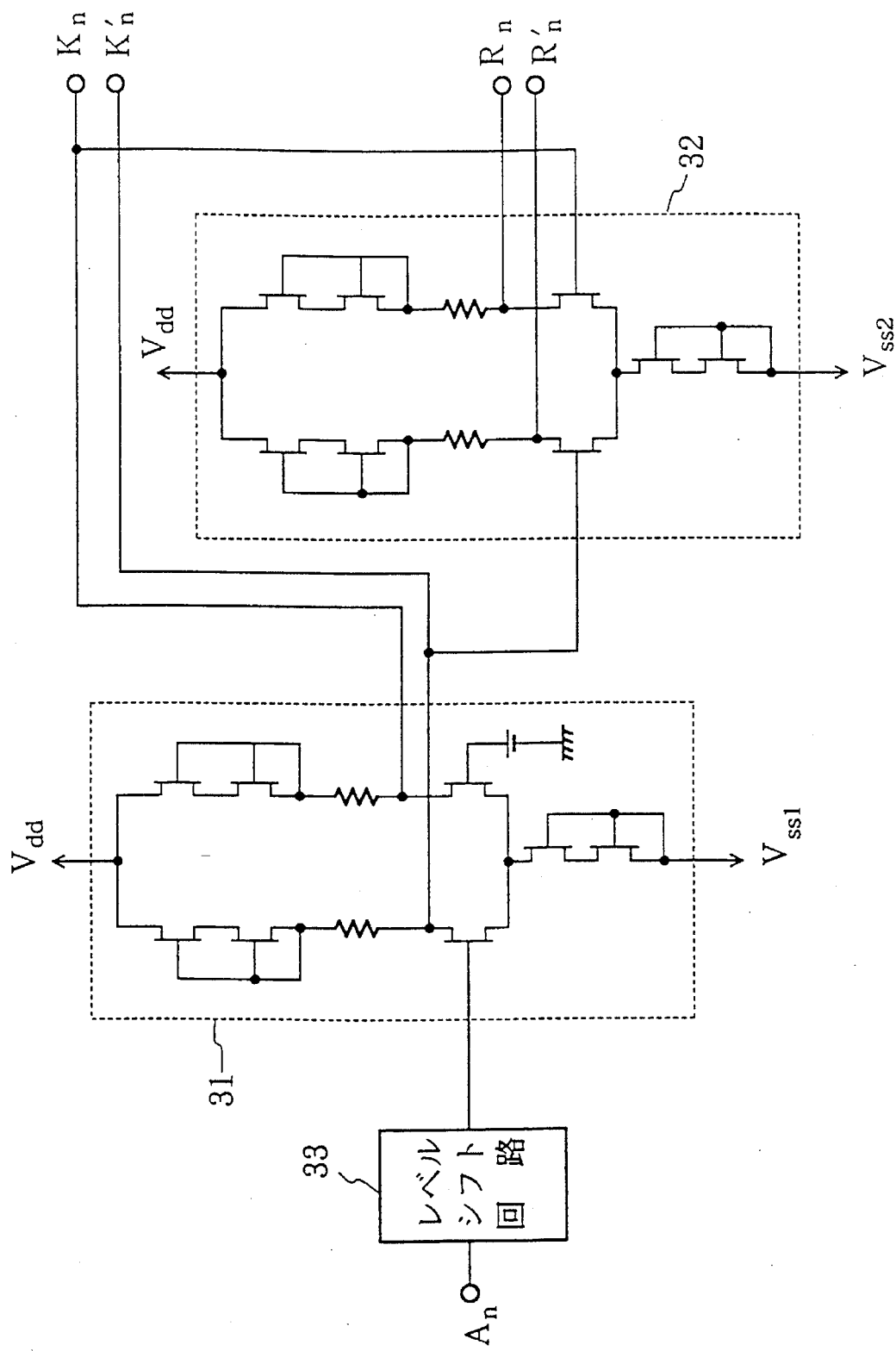
FIG. 4 is a diagram showing one example of driving circuit for the circuit shown in FIG. 3.

FIG. 4 shows examples of the driver circuits $DRV_0$, $DRV_1$, and $DRV_2$ used in the demultiplexer circuit shown in FIG. 3.

The circuits fundamentally form a so-called source-coupled FET logic (SCFL), and consist of a first circuit 31 and a second circuit 32. For instance, in the example of FIG. 1, if −5 V, −10 V, −5 V, and 0 V are needed as $K_n$, $K-_n$, $R_n$, and $R_n$, respectively, then the relations $V_{dd}$=0 V, $V_{ss}1$=−10 V, and $V_{ss}2$=−5V should be satisfied in FIG. 4. Since the SCFL is a circuit adapted for high-speed operation less than nano second, it can be preferably used as a driver circuit for a multiplexer circuit or for a demultiplexer circuit requiring high-speed switching action.

Where an external control signal $A_n$ is an ECL signal, for example, a level shift circuit 33 is disposed between the SCFL and the outside to convert the logic level.

In the demultiplexer configuration of FIG. 3, the 1:2 demultiplexer circuits are connected in cascade and so the ON resistance between the input and output terminals is increased by a factor equal to the number of stages through which the signal passes. Attenuation of the input signal level due to the ON resistance can be prevented by making the load resistances $R_{Ln}$ (in the figure, n=0, 1, . . . , 7) sufficiently large compared with the ON resistance.

Figure 5:
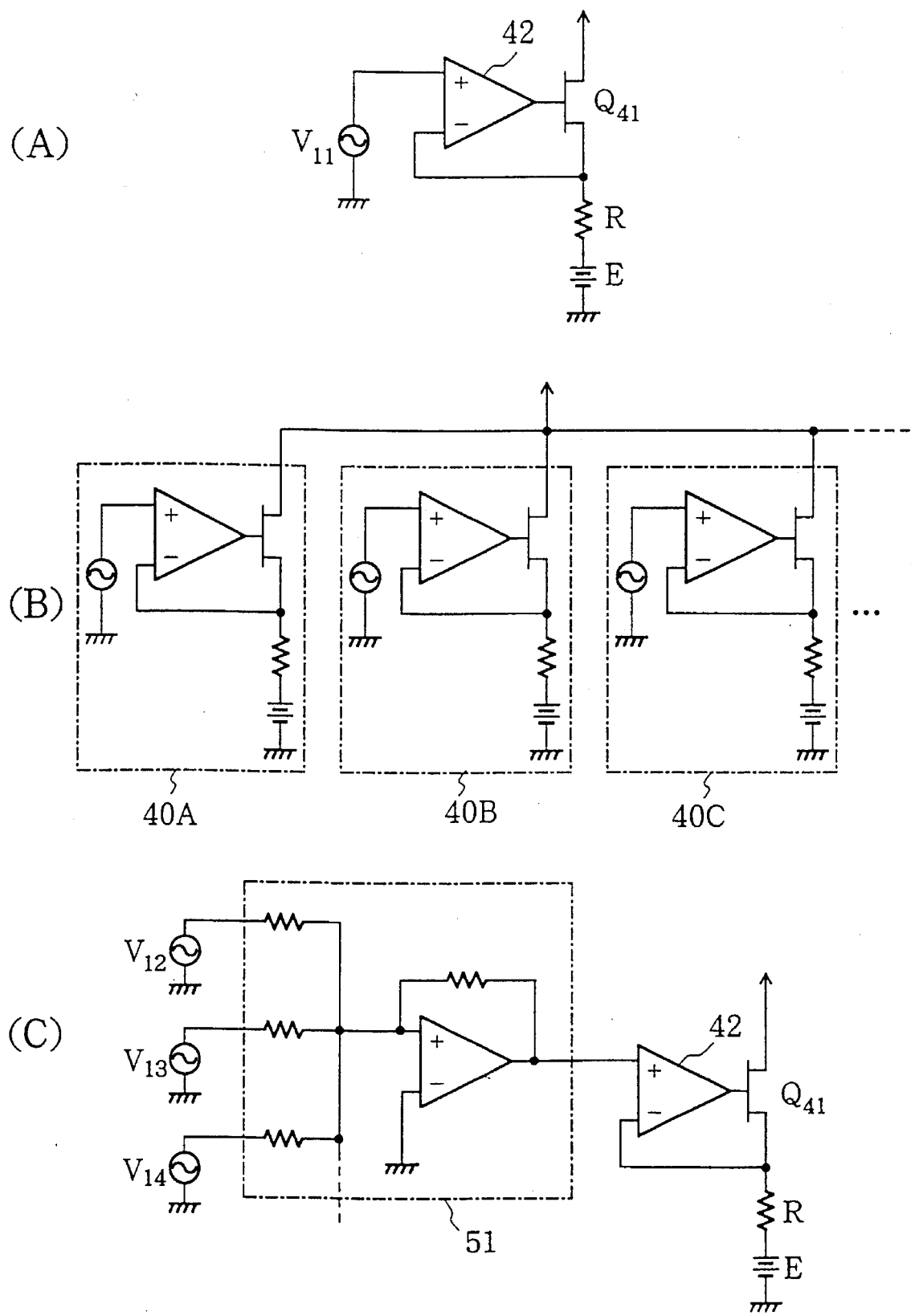
FIG. 5 shows diagrams showing constant-current signal sources for a signal-generating circuit according to the invention.

A signal source as shown in FIG. 5(A) can be used for the constant-voltage signal source as shown in FIG. 3. In FIG. 5(A), an operational amplifier 42 has a non-inverting input terminal to which a voltage source $V_{11}$ is connected, the other end of the voltage source being grounded. The amplifier has an output terminal to which the gate terminal of $Q_{41}$ is connected. The source terminal of the $Q_{41}$ is grounded via a resistor and via a DC voltage source E and is connected with the non-inverting input terminal of the amplifier 42. A demultiplexer circuit which is less affected by the ON resistance can be built by using the constant-voltage signal source having a large output impedance as described above.

As shown in FIG. 5(B), a signal supply circuit which sums up plural input signal currents can be fabricated by connecting constant-current signal sources 40A, 40B, etc. as shown in FIG. 5(A) in parallel.

In the above-described signal supply circuit, if the number of signal sources is large and if the signal frequency is high, then the circuit is affected greatly by the junction capacitances of the FETs and by the ON resistance. As a result, the circuit may not act as a constant-current source. In this case, a signal supply circuit as shown in FIG. 5(C) can be employed. In this circuit, a plurality of voltage sources $V_{12}$, $V_{13}$, etc. are connected with the input terminal of an analog adder 51 instead of the single voltage source $V_{11}$ of FIG. 5(A). This circuit is not affected by the junction capacitances or by the ON resistance if the number of the signal sources is increased.

As described thus far, the novel signal selector circuit regulates the voltage between the gate and the source of each switching FET against variations in the flowing current when the FET is conducting.

Specially, a circuit can be realized in which the voltage between the gate and the source is not modulated in spite of variations in the signal current. Hence, a demultiplexer circuit can be accomplished which has better linearity and better distortion characteristics at high frequencies than the prior art circuit configuration.

Of course, the circuit of the present embodiment can be applied to analog switches for switching analog or digital signals as well as to demultiplexer circuits.

Figure 6:
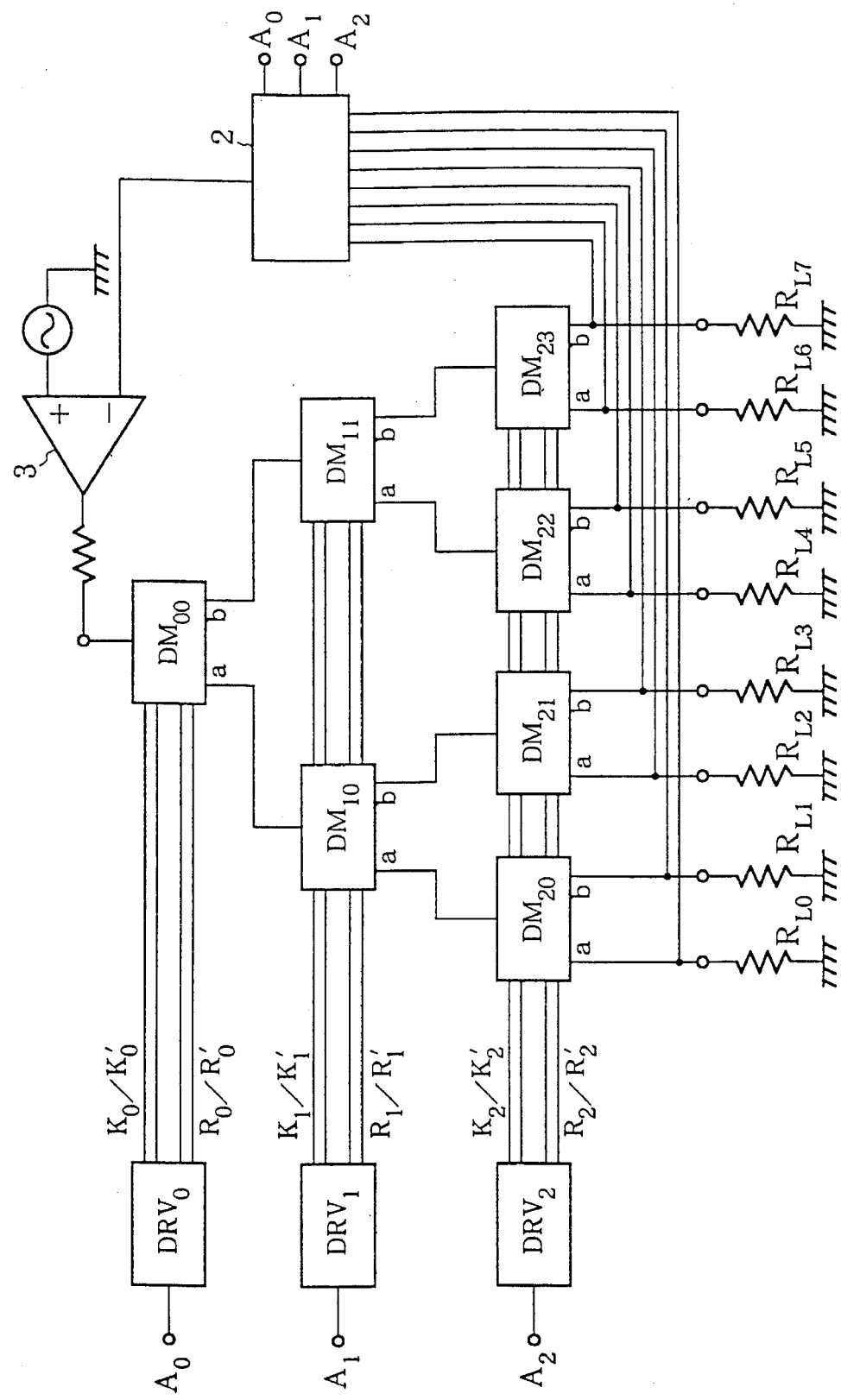
FIG. 6 is a diagram of a further signal selector circuit according to the invention.

A signal selector circuit which feeds its output signal to its input in accordance with the present invention is next described by referring to FIG. 6. In the demultiplexer circuit in this figure, 1:2 demultiplexer circuits (see FIG. 1) are cascaded in three stages. A driver circuit for driving the demultiplexer circuits of each stage is connected with each stage, in the same way as the 1:8 demultiplexer circuit shown in FIG. 3. It is to be noted that like components are indicated by like reference numerals in both FIGS. 4 and 6.

In FIG. 6, a selector circuit 2 is added to the negative feedback loop for the output signal. The signal fed back is applied to the inverting terminal of the operational amplifier 3 placed before the input terminal. The input signal is applied to the non-inverting terminal of the amplifier 3.

The demultiplexer circuits $DM_{00}$, $DM_{10}$, $DM_{11}$, $DM_{20}$, $DM_{21}$, $DM_{22}$, and $DM_{23}$ forming the various stages and the driver circuits $DRV_0$, $DRV_1$, and $DRV_2$ for the various stages are similar in operation to the counterparts shown in FIG. 3 except that a negative feedback loop is formed by the selected single signal path, the operational amplifier 3, and the selector circuit 2. In particular, if the gain of the closed loop including the operational amplifier 3 is sufficiency large, the operation is such that the output from the amplifier 3 (i.e., the input to the demultiplexer circuit) is equal to the output signal. In this case, the selector circuit 2 detects the voltage at the output end of the selected demultiplexer circuit by using the same control signals as the control signals $A_0$, $A_1$, and $A_2$ for the demultiplexer circuits.

Figure 7:
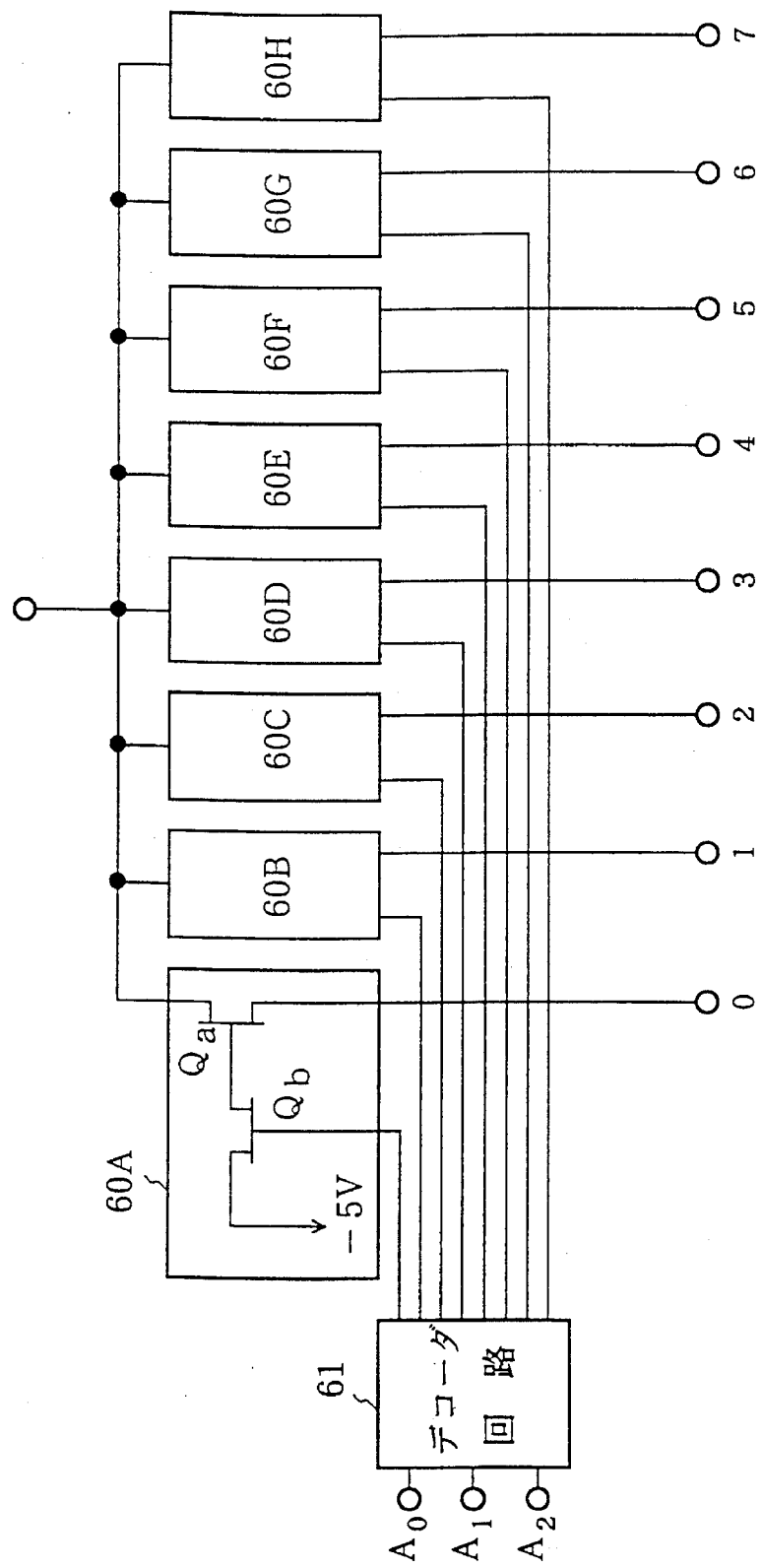
FIG. 7 is a diagram illustrating one example of the selector circuit shown in FIG. 6.
Figure 8:
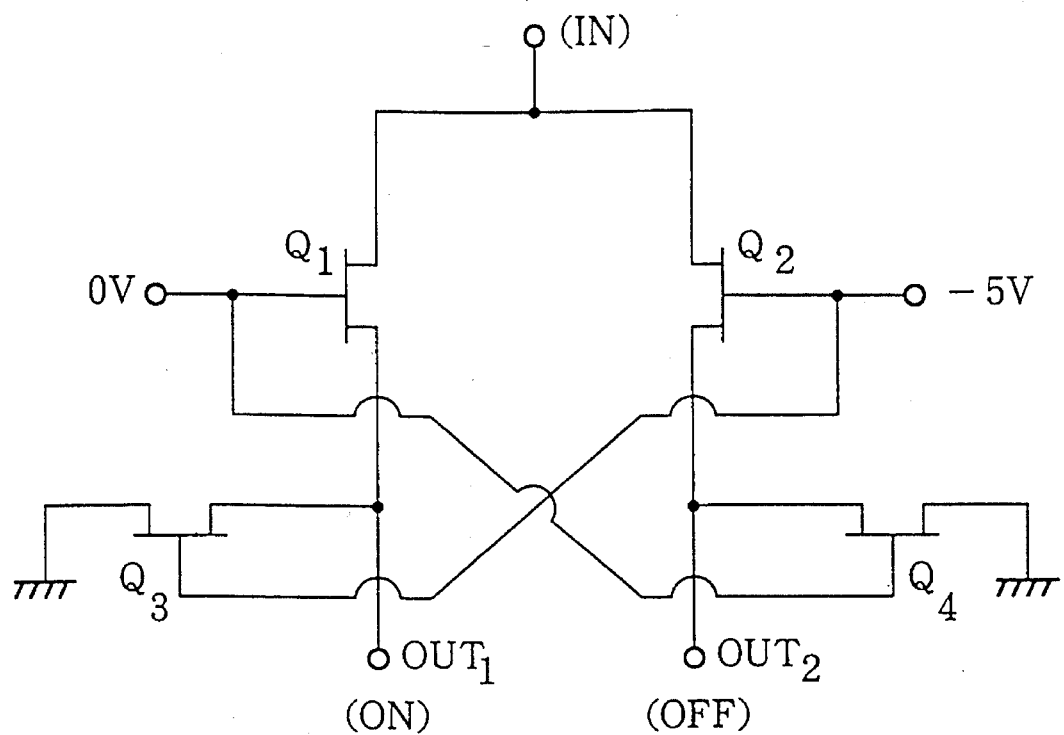
FIG. 8 is a diagram of a conventional 1:2 demultiplexer circuit.
Figure 8:
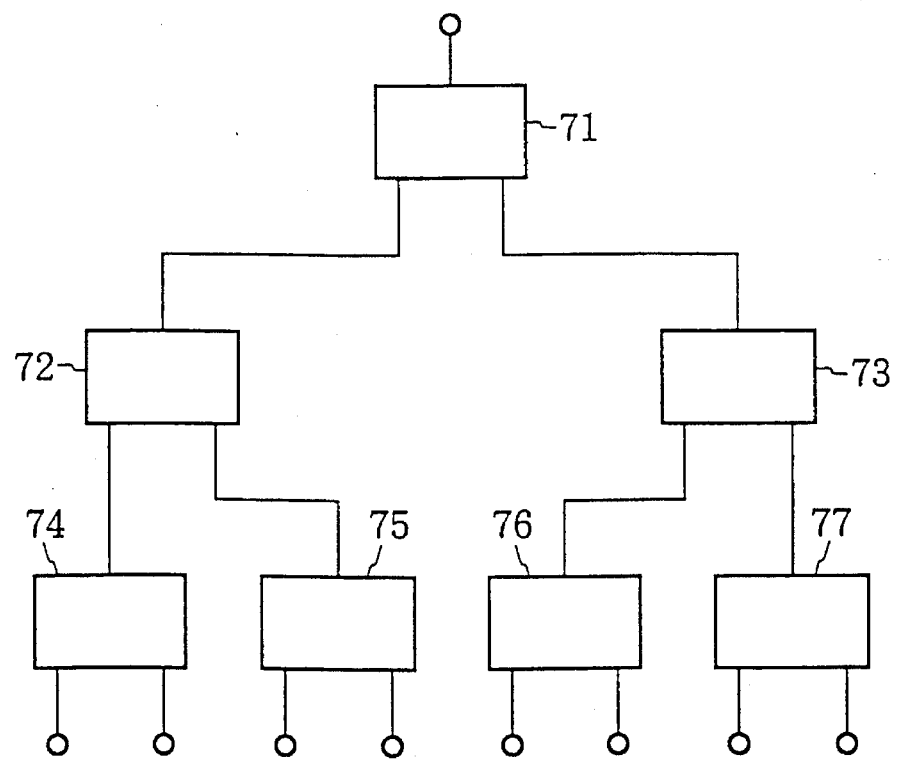
Figure 9:
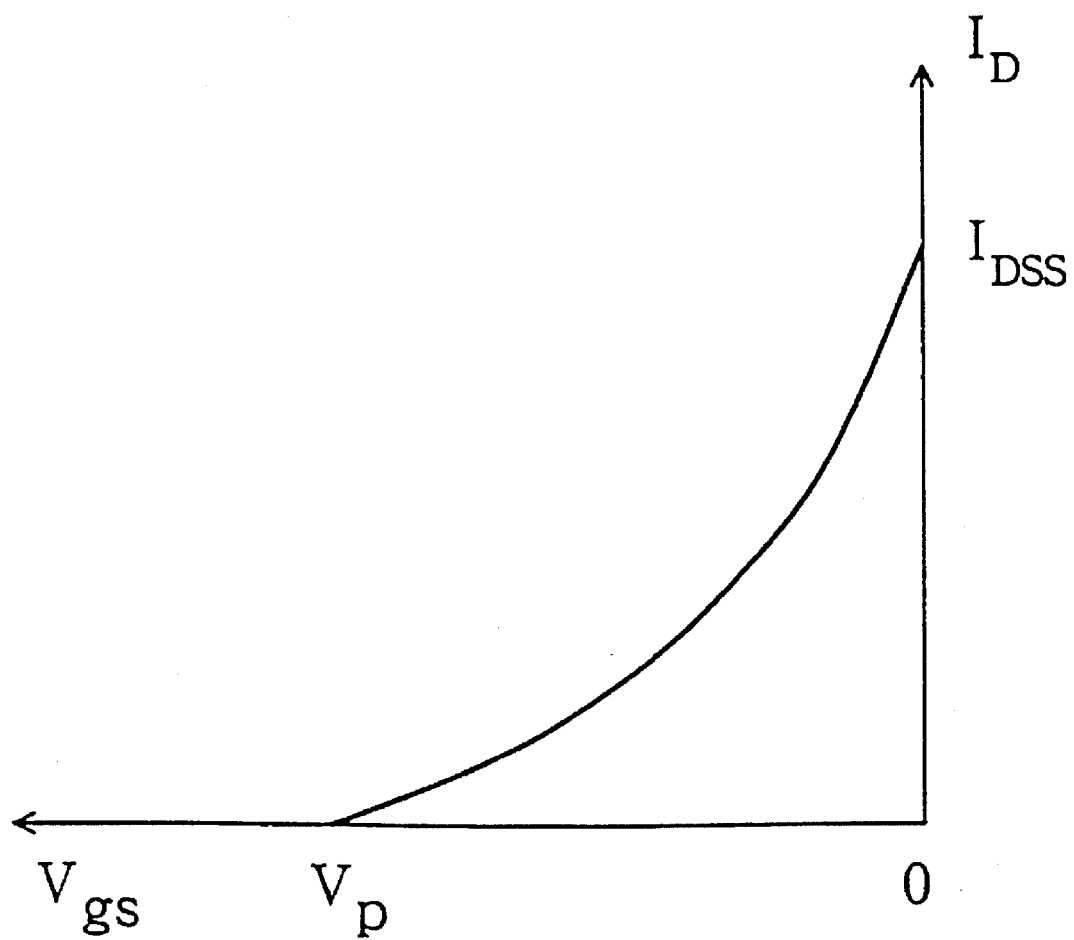
FIG. 9 is a diagram of a conventional IN demultiplexer circuit.

FIG. 7 shows one example of the selector circuit 2. This selector circuit 2 comprises 8 switch circuits 60A–60H and a decoder circuit 61. Each of the switch circuits 60A–60H consists of a switching FET $Q_a$ and a gate-driving FET $Q_b$. The output signals from terminals 0–7 to which $R_{L0}$–$R_{L7}$ shown in FIG. 6 are connected are applied to the drain terminals of the Qa of the switch circuits 60A–60H. A control signal from the decoder circuit 61 is applied to the gate terminals of Qb The control signals $A0$, $A_1$, and $A_2$ from the driver circuits DRV0, DRV1, and DRV2 shown in FIG. 6 are applied to the decoder circuit 61, which produces the control signals to the Qb.

The decoder circuit 61 can know the signal output terminal from $A_0$, $A_1$, and $A_2$ and drives on the gate-driving FET Qb for the switching circuit corresponding to the signal output terminal, thus bringing the switching FET Qa into conduction.

The switching FET Qa may be inferior in ON resistance and linearity to the switching FETs used in the 1:2 demultiplexer circuit shown in FIG. 1.

By constructing the demultiplexer circuit as described above, a demultiplexer circuit which is less affected by the ON resistance, temperature variations, or the variations in the characteristics of the switching FETs and has better accuracy than the demultiplexer circuit shown in FIG. 3 can be accomplished. At frequencies at which the gain of the closed loop including the operational amplifier 3 is large, distortion characteristics better than the distortion characteristics of the demultiplexer circuit shown in FIG. 3 can be obtained by the effect of negative feedback.

As described thus far, the present invention yields the following advantages.

(1) Difficulties due to self-modulation of the voltage between the gate and the source caused by variations in the input current can be alleviated. The variations in the input current are induced by the fact that the gate potential of each FET is fixed at a constant value when a switching action is performed as encountered in the prior art signal selector circuit such as a demultiplexer or a multiplexer.

That is, in the novel signal selector circuit, the voltage between the gate and source of each FET is regulated against variations in the passing current when a switch is caused to conduct. Therefore, a circuit can be realized in which the voltage between the gate and the source is not modulated by variations in the current. Consequently, a signal selector circuit having better linearity between the input and output signals and better distortion characteristics at high frequencies than the prior art circuit configuration can be offered.

(2) Conventional apparatus, especially apparatus treating high-frequency analog signals, have been urged to adopt reed relays or other mechanical switches for a signal selector circuit such as a demultiplexer or a multiplexer.

A signal selector circuit or a signal-generating circuit according to the present invention can switch analog signals or mixture of analog and digital signals without distorting the wave forms.

If novel signal selector circuits are used as a multiplexer circuit and as a demultiplexer circuit simultaneously, bidirectional switching which is excellent in linearity and free of waveform distortion can be attained.

(3) Where an operational amplifier is incorporated in the input stage of a signal selector circuit used as a demultiplexer circuit and the output signal from the demultiplexer circuit is fed back to the amplifier, the voltage drop due to the ON resistance of each switching FET can be canceled out. Hence, the output waveform can be made coincident with the input waveform.

(4) The novel signal-generating circuit can form a signal-generating circuit which is hardly affected by the power resistance or by the ON resistance (power resistance) of each switching FET. The novel circuit can also produce the sum of plural signals at a desired output terminal without being affected by the ON resistance.

What is claimed is:

1. A signal selector circuit, comprising:

a pair of switching field effect transistors (FETs) having a depletion characteristic or depletion/enhancement combined characteristics, said FETs having coupled drain terminals for use as a signal input terminal, and source terminals not coupled together for use as signal output terminals, and gate terminals;

circuits connected with said gate terminals of said switching FETs, said circuits exhibiting a high impedance when the gates are activated so as to drive the FETs on; wherein, when the gate of each switching FET is short-circuited to the source or to the drain or when the FET is driven on, the gate is connected with the source or drain via a resistance lower than the impedances of the circuits connected with the gate terminals; and an operational amplifier operatively connected to placed before the input terminal of the signal selector circuit, and wherein there is further provided a circuit which feeds the output signal from the signal selector circuit back to the operational amplifier.

2. The signal selector circuit of claim 1, wherein the signal selector circuit comprises circuits cascaded in plural stages, and wherein the uncoupled source terminals of the switching FETs of one stage are connected with the coupled drain terminals of the switching FETs of a next stage; and further comprising a signal supply circuit comprising at least two signal sources connected with the input terminal of the signal selector circuit.

3. A signal selector circuit, comprising:

a pair of switching field effect transistors (FETs) having a depletion characteristic or depletion/enhancement combined characteristics, said FETs having coupled drain terminals for use as a signal input terminal, and source terminals not coupled together for use as signal output terminals, and gate terminals;

circuits connected with said gate terminals of said switching FETs, said circuits exhibiting a high impedance when the gates are activated so as to drive the FETs on; wherein, when the gate of each switching FET is short-circuited to the source or to the drain or when the FET is driven on, the gate is connected with the source or drain via a resistance lower than the impedances of the circuits connected with the gate terminals; and a signal supply circuit comprising at least two sources connected with the input terminal of the signal selector circuit.

4. The signal selector circuit of claim 3, wherein the signal supply circuit comprises at least two signal sources, wherein the output signals from the signal sources are summed and applied to the input terminal of the signal selector circuit.

5. The signal selector circuit of claim 3, wherein the signal selector circuit comprises circuits cascaded in plural stages, and wherein the uncoupled source terminals of the switching FETs of one stage are connected with the coupled drain terminals of the switching FETs of a next stage; and further comprising an operational amplifier operatively connected to before the input terminal of the signal selector circuit, and wherein there is further provided a circuit which feeds the output signal from the signal selector circuit back to the operational amplifier.

6. A signal selector circuit, comprising:

a first switching field effect transistors (FET) ($Q_{11}$) and a second switching FET ($Q_{12}$), said FETs having coupled drain terminals for use as a signal input terminal, and source terminals not coupled together for use as signal output terminals, and gate terminals;

a first impedance ($R_{11}$) coupled between the gate and source of the first switching FET and a second impedance ($R_{12}$) coupled between the gate and source of the second switching FET; and circuits connected with said gate terminals of said first and second switching FETs, said circuits exhibiting a high impedance when the gates are activated to drive the FETs on;

wherein the impedances of the first and second resistances are lower than the impedances of the circuits connected with the gate terminals.

7. The signal selector circuit of claim 6, further comprising a third FET ($Q_{13}$) coupled to the source of said first FET, and a fourth FET ($Q_{14}$) coupled to the source of said second FET, wherein said third and fourth FETs provide isolation between said output terminals.

8. The signal selector circuit of claim 6, wherein the circuits connected with the gate terminals comprise FETs whose drain terminals are connected with the gate terminals of the switching FETs.

9. The signal selector circuit of claim 6, wherein the signal selector circuit comprises circuits cascaded in plural stages, and wherein the uncoupled source terminals of the switching FETs of one stage are connected with the coupled drain terminals of the switching FETs of a next stage.

10. The signal selector circuit of claim 6, further comprising an operational amplifier operatively connected to before the input terminal of the signal selector circuit, and wherein there is further provided a circuit which feeds the output signal from the signal selector circuit back to the operational amplifier.

11. The signal selector circuit of claim 6, further comprising a signal supply circuit comprising at least two signal sources connected with the input terminal of the signal selector circuit.

12. The signal selector circuit of claim 11, wherein the signal supply circuit comprises at least two signal sources, wherein the output signals from the signal sources are summed and applied to the input terminal of the signal selector circuit.

13. The signal selector circuit of claim 6, wherein the circuits connected with the gate terminals comprise FETs whose drain terminals are connected with the gate terminals of the switching FETs; further comprising a third FET ($Q_{13}$) coupled to the source of said first FET, and a fourth FET ($Q_{14}$) coupled to the source of said second FET, wherein said third and fourth FETs provide isolation between said output terminals; further comprising an operational amplifier operatively connected to before the input terminal of the signal selector circuit, and wherein there is further provided a circuit which feeds the output signal from the signal selector circuit back to the operational amplifier; and further comprising a signal supply circuit comprising at least two signal sources connected with the input terminal of the signal selector circuit, wherein the output signals from the signal sources are summed and applied to the input terminal of the signal selector circuit.

* * * * *